United States Patent
Jindal et al.

(10) Patent No.: US 9,297,855 B1
(45) Date of Patent: Mar. 29, 2016

(54) INTEGRATED CIRCUIT WITH INCREASED FAULT COVERAGE

(71) Applicants: Anurag Jindal, Patiala (IN); Huangsheng Ding, Suzhou (CN); Ling Wang, Suzhou (CN)

(72) Inventors: Anurag Jindal, Patiala (IN); Huangsheng Ding, Suzhou (CN); Ling Wang, Suzhou (CN)

(73) Assignee: FREESCALE SEMIOCNDUCTOR,INC., Austin, TX (US)

( * ) Notice: Subject to any disclaimer, the term of this patent is extended or adjusted under 35 U.S.C. 154(b) by 7 days.

(21) Appl. No.: 14/559,899

(22) Filed: Dec. 3, 2014

(30) Foreign Application Priority Data

Nov. 7, 2014 (CN) .......................... 2014 1 0638138

(51) Int. Cl.
| | |
|---|---|
| *G06F 17/50* | (2006.01) |
| *G06F 11/26* | (2006.01) |
| *G06F 11/27* | (2006.01) |
| *G01R 31/3177* | (2006.01) |
| *G06F 11/263* | (2006.01) |

(52) U.S. Cl.
CPC ........ *G01R 31/3177* (2013.01); *G06F 17/5045* (2013.01); *G06F 11/26* (2013.01); *G06F 11/261* (2013.01); *G06F 11/263* (2013.01); *G06F 11/27* (2013.01); *G06F 17/5022* (2013.01)

(58) Field of Classification Search
CPC ... G06F 17/5022; G06F 11/26; G06F 11/261; G06F 11/263; G06F 11/27
USPC .................. 716/100, 106, 136; 714/724, 726, 714/727–728, 732–736, 738–741
See application file for complete search history.

(56) References Cited

U.S. PATENT DOCUMENTS

| | | | |
|---|---|---|---|
| 5,828,828 A | 10/1998 | Lin et al. | |
| 6,629,277 B1* | 9/2003 | Sanghani | G01R 31/318552 714/727 |
| 6,934,921 B1 | 8/2005 | Gu et al. | |
| 7,721,170 B2* | 5/2010 | Grise | G01R 31/318594 714/30 |
| 8,035,411 B2* | 10/2011 | Oda | G01R 31/318575 326/16 |
| 8,707,227 B2* | 4/2014 | Gizdarski | G01R 31/318335 716/104 |
| 8,868,989 B2* | 10/2014 | Jindal | G06F 11/2215 714/41 |
| 2003/0110431 A1* | 6/2003 | Davies | G01R 31/318541 714/726 |
| 2008/0295050 A1 | 11/2008 | Maeda | |
| 2011/0022906 A1 | 1/2011 | Sasaki | |
| 2011/0126063 A1 | 5/2011 | Harada | |

(Continued)

OTHER PUBLICATIONS

Gu, Xinli et al, "An effor-minimized logic BIST implementation method", 2001, IEEE, ITC International Test Conference Paper 36.1, pp. 1002-1010.*

(Continued)

*Primary Examiner* — Stacy Whitmore
(74) *Attorney, Agent, or Firm* — Charles E. Bergere

(57) ABSTRACT

An electronic design automation (EDA) tool for increasing the fault coverage of an integrated circuit (IC) design includes a processor that inserts at least one XOR gate, an AND gate, an OR gate and a multiplexer between observation test points and an existing first scan flip-flop of the IC design. The XOR gate provides an observation test signal to the first scan flip-flop by way of the AND gate, the OR gate, and the multiplexer such that the observation test signal covers the presence of faults at the observation test points. The first scan flip-flop outputs a data input signal, a set of test patterns, and a first set of test signals based on the observation test signal to indicate whether the IC design is faulty or not. A testable IC that can be structurally tested is fabricated using the IC design.

19 Claims, 6 Drawing Sheets

(56) References Cited

U.S. PATENT DOCUMENTS

2014/0019818 A1* 1/2014 Jindal .................. G06F 11/2215
714/724
2015/0346281 A1* 12/2015 Bheemanna ... G01R 31/318552
714/727

OTHER PUBLICATIONS

Heatherington, Graham, et al., "Logic BIST for large industrial designs: REal Issue and Case staudies", 1999, IEEE, ITC international test conference, Paper 14.2, pp. 358-367.*

* cited by examiner

INTEGRATED CIRCUIT WITH INCREASED FAULT COVERAGE

BACKGROUND OF THE INVENTION

The present invention relates generally to electronic design automation (EDA) tools, and, more particularly, to an EDA tool for increasing fault coverage of an integrated circuit.

Integrated circuits (ICs) often include various analog and digital components. Such ICs may have manufacturing defects that are caused by dust particle contamination during fabrication, which can cause the ICs to malfunction. Thus, testing the ICs to detect such manufacturing defects is very important. Design-for-test (DFT) techniques add testability features to the ICs to check for and identify manufacturing defects. DFT enables automatic-test-equipment (ATE) to execute various fault tests on the IC. The ATEs use test patterns generated by test pattern generators such as, automatic test pattern generators (ATPG), pseudo-random pattern generators (PRPG), and so on, to detect faults in the ICs. The ICs that undergo such fault tests are referred to as circuits under test (CUT).

DFT enables detection of design faults of a CUT using automation, and hence reduces the time and cost required for development and execution of the fault tests. DFT techniques should provide coverage over all the design faults of the CUT. DFT techniques include various fault models such as transition, path delay, and stuck-at fault models. A transition fault model is used to detect a failure of a state transition at a particular element of the CUT that propagates through the CUT within a specific time period. A path delay fault model calculates a sum of delays at each element in a path within the CUT and detects faults by comparing the sum of delays of the path with a delay of a critical path. The stuck-at fault models such as, stuck-at '0' and stuck-at '1' fault models, are used to detect faulty connections between various elements of the CUT that cause a logic of the CUT to be stuck-at a particular logic state i.e., logic zero or logic one. Based on the source of the test patterns, DFT techniques are classified as either scan testing or built-in-self-testing (BIST).

Generally, scan testing is used for detecting design faults. The CUT, when subjected to scan testing, operates in two modes—a test mode (also referred to as shift operation) and a functional mode (also referred to as capture operation). At the beginning of the scan testing, the CUT is set in the test mode. In the test mode, the CUT is divided into multiple on-chip logic modules. Each on-chip logic module is further segmented into scan chains or paths. Digital logic elements (e.g., flip-flops, latches, and data registers) of an logic module are connected together to form scan chains or paths. The ATE serially scans a first test pattern generated by an ATPG into the digital logic elements of the scan paths. The CUT is then switched to the functional mode where the primary outputs of the CUT are observed and primary inputs of the CUT are set according to the functional requirement of the design of the CUT for one clock cycle of a clock signal of the CUT. The CUT is then switched back to the test mode and outputs of the scan paths are observed in each clock cycle. The ATE then loads a second test pattern into the scan paths when the previous test pattern is shifted out to a multiple input signature reader (MISR) for analysis. The process is repeated until required fault coverage of the CUT is met. The ATPG uses a gate-level representation of a netlist of the CUT to generate the test patterns and hence, the test patterns are deterministic. However, the ATPG does not have enough memory capacity to store an entire test set that covers all of the transition, path-delay, and stuck-at fault models.

BIST is a self-test mechanism provided to enable self-checking of logic within the CUT. For example, BIST procedures are often integrated in ISO 26262 standard compliant automotive electronic devices where testing of safety features is crucial. BIST is similar to scan testing, but uses a PRPG, such as a linear feedback shift register (LFSR), instead of the ATPG, for generating pseudo random test patterns. Since BIST does not require any additional equipment such as ATPGs for fault testing, BIST can be performed in the field (i.e., outside of the IC assembly house). BIST requires less time than scan testing to perform fault test methods, and hence, reduces manufacturing costs. However, the pseudo random test patterns that are applied to the CUT during BIST do not provide sufficient fault coverage and often miss hard to detect faults. To overcome the aforementioned disadvantages, ICs include observation and control test points. Observation test points are outputs of the logic elements that are used to detect faults and control test points are the inputs to the logic elements that are used to control the inputs.

EDA tools are used during the design stage of an IC, for example, for layout/floor planning of the various circuit components of the IC and the fault coverage requirements. FIG. 1A shows a schematic block diagram of a conventional IC 100 that is being structurally tested using observation and control test points. The IC 100 includes a first set of observation test points (A, B, C, D, E, F, G, and H) corresponding to outputs of a first set of logic elements (not shown) of the IC 100, first, second, and third XOR gates 102, 104, and 106, and a first scan flip-flop 108. First, second, third and fourth input terminals of the first XOR gate 102 are connected to the observation test points A, B, C, and D, respectively. An output terminal of the first XOR gate 102 outputs a first test signal. First, second, third and fourth input terminals of the second XOR gate 104 are connected to the observation test points E, F, G, and H, respectively. An output terminal of the second XOR gate 104 outputs a second test signal. The third XOR gate 106 has a first input terminal connected to the output terminal of the first XOR gate 102 for receiving the first test signal, a second input terminal connected to the output terminal of the second XOR gate 104 for receiving the second test signal, and an output terminal for outputting an observation test signal. The first scan flip-flop 108 is connected between the third XOR gate 106 and a second scan flip-flop (not shown) of a scan chain of the IC 100. The first scan flip-flop 108 has a data input terminal connected to the output terminal of the third XOR gate 106 for receiving the observation test signal, a scan input terminal for receiving a set of test patterns, a scan enable input terminal for receiving a scan enable signal, and a clock input terminal for receiving a clock signal. In an example, the set of test patterns can be generated by an ATPG (not shown) or a PRPG (not shown) when the IC 100 is undergoing testing using an ATE. In another example, the set of test patterns are generated internally by the IC 100 when BIST is invoked. An output terminal of the first scan flip-flop 108 is connected to the second scan flip-flop for outputting at least one of the observation test signal and the set of test patterns based on a logic state of the scan enable signal.

In operation, when the scan enable signal is high, i.e., during the shift operation of the IC 100, the set of test patterns are output at the output terminal of the first scan flip-flop 108. When the scan enable signal is low, i.e., during the capture operation of the IC 100, the observation test signal is output at the output terminal of the first scan flip-flop 108. Hence, required fault coverage of the IC 100 is met. However, the IC 100 includes multiple sets of observation test points and for each set of observation test points, an additional scan flip-flop is inserted in the scan paths. Therefore, the length of the scan paths increase, which increases the area overhead and the time required for testing the IC 100.

FIG. 1B shows another conventional IC 110 that is that can be tested using the observation and control test points. The first scan flip-flop 108 of FIG. 1A is replaced with a fourth XOR gate 112 and an AND gate 112. The IC 110 also includes a third scan flip-flop 116, which is a pre-existing scan flip-flop of the scan path. The AND gate 114 has a first input terminal connected to the output terminal of the third XOR gate 106 for receiving the observation test signal, a second input terminal for receiving an observation test point enable signal, and an output terminal for outputting the observation test signal. The fourth XOR gate 112 has a first input terminal connected to the output terminal of the AND gate 114 for receiving the observation test signal and a second input terminal for receiving a data input signal from a functional path of the IC 110. A data input terminal of the third scan flip-flop 116 is connected to an output terminal of the fourth XOR gate 112 for receiving one of the observation test signal and the data input signal based on logic states of the observation test point enable and observation test signals. A scan input terminal of the third scan flip-flop 116 receives the set of test patterns. A scan enable input terminal of the third scan flip-flop 116 receives the scan enable signal and the clock input terminal thereof receives the clock signal.

In operation, the observation test point enable signal is high during testing. When the scan enable signal is high, i.e., during the shift operation, the set of test patterns are output at the output terminal of the third scan flip-flop 116. When the scan enable signal is low during the capture operation, one of the observation test signal and the data input signal are output at the output terminal of the third scan flip-flop 116. The logic state of the observation test signal indicates whether the IC 110 is faulty or non-faulty. Thus, the output of the third scan flip-flop 116 indicates whether the IC 110 is faulty, and hence enables fault detection. Since the entire set of observation test points are covered by the test technique, the required fault coverage for the IC 100 is met. Since the third scan flip-flop 116 is an existing scan flip-flop of the scan path, no additional scan flip-flop corresponding to the first set of observation test points is required. However, the fourth XOR gate 112 adds a delay to the functional timing of the IC 100 during functional mode of operation.

Therefore, it would be advantageous to have an IC design with increased fault coverage and an EDA tool that can modify an IC design to generate an IC design having improved fault coverage but not increased area or functional timing.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1A:
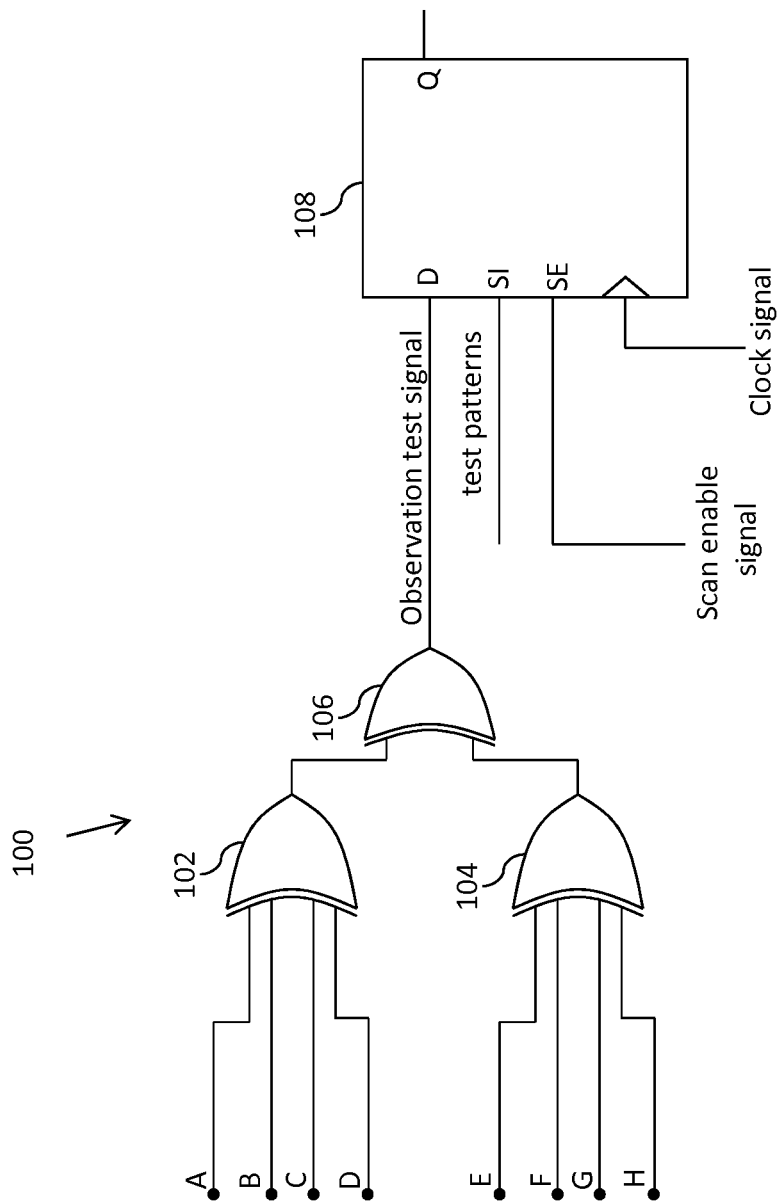
FIGS. 1A and 1B are schematic block diagrams of conventional integrated circuits undergoing structural testing.
Figure 1B:
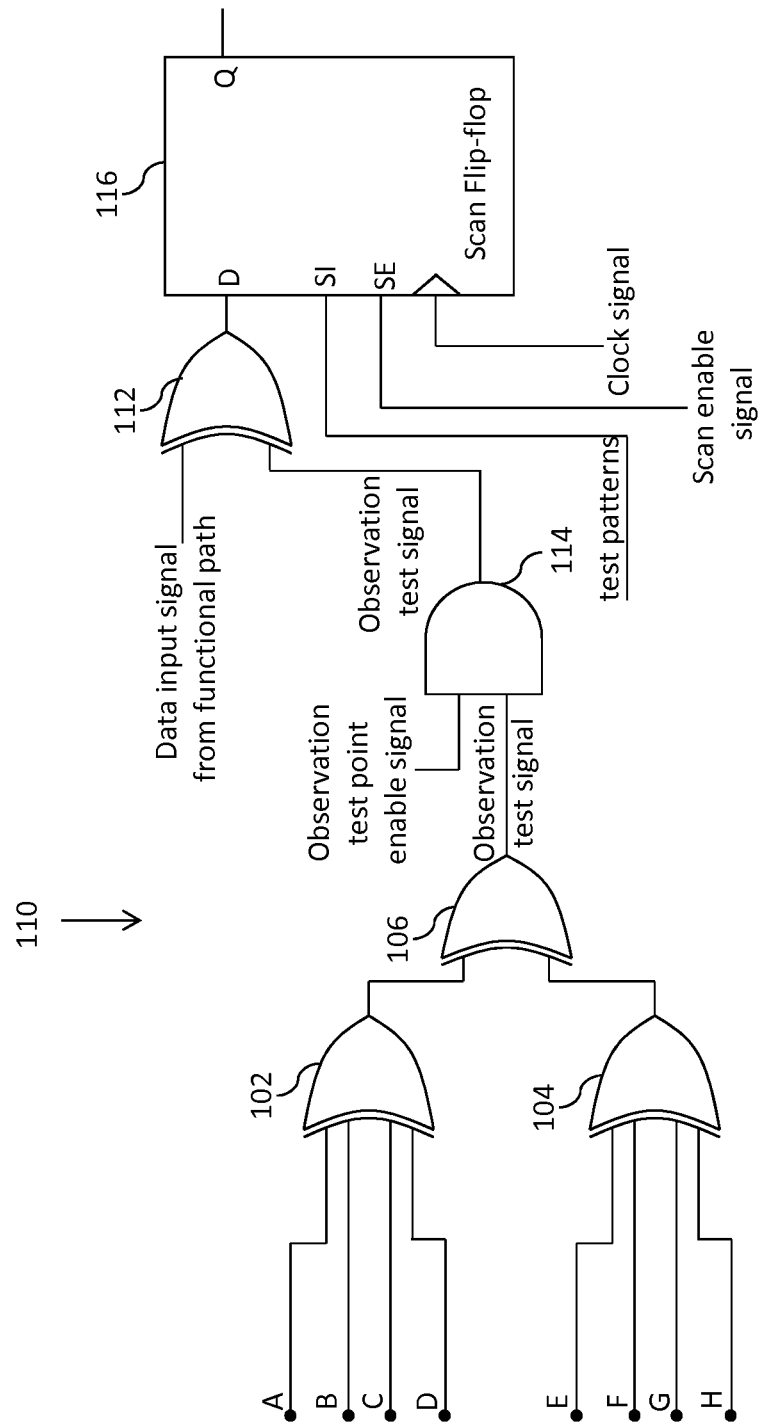

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, an electronic design automation (EDA) tool for increasing the fault coverage of an integrated circuit design is provided. The integrated circuit design includes a plurality of observation test points corresponding to outputs of a plurality of logic elements of the integrated circuit design. The EDA tool includes a memory that stores the integrated circuit design and a processor that is in communication with the memory. The processor includes means for identifying a first scan flip-flop of the integrated circuit design corresponding to a first set of observation test points of the plurality of observation test points. The first set of observation test points generates a first set of test signals. The processor further includes means for inserting at least one XOR gate, an AND gate, and an OR gate between the first set of observation test points and the first scan flip-flop. The processor connects a first set of input terminals of the at least one XOR gate to the first set of observation test points for receiving corresponding first set of test signals. The processor connects an output terminal of the at least one XOR gate to a first input terminal of the AND gate for providing an observation test signal thereto. The processor connects an output terminal of the AND gate to a first input terminal of the OR gate. The processor connects an output terminal of the OR gate to a scan enable input terminal of the first scan flip-flop. The processor further includes means for providing an observation test point enable signal to a second input terminal of the AND gate, a scan enable signal to a second input terminal of the OR gate, and a data input signal and a set of test patterns to data and scan input terminals of the first scan flip-flop, respectively. The AND gate provides the observation test signal to the OR gate based on the observation test point enable signal and the OR gate provides the observation test signal to the scan enable input terminal of the first scan flip-flop based on the scan enable signal. The processer further includes means for observing at least one of the data input signal and the set of test patterns at an output terminal of the first scan flip-flop.

In another embodiment of the present invention, an electronic design automation (EDA) tool for increasing the fault coverage of an integrated circuit design is provided. The integrated circuit design includes a plurality of observation test points corresponding to outputs of a plurality of logic elements of the integrated circuit design. The EDA tool includes a memory that stores the integrated circuit design and a processor that is in communication with the memory. The processor includes means for identifying a first scan flip-flop of the integrated circuit design corresponding to a first set of observation test points of the plurality of observation test points. The first set of observation test points generates a first set of test signals. The processor further includes means for inserting a multiplexer between the first set of observation test points and the first scan flip-flop. The processor connects a first input terminal of the multiplexer to the first set of observation test points for receiving the first set of test signals. The processor connects an output terminal of the multiplexer to a scan input terminal of the first scan flip-flop. The processor further provides means for providing a set of test patterns to a second input terminal of the multiplexer, a test control signal to a select input terminal of the multiplexer, scan enable signal and data input signals to scan enable and data input terminals of the first scan flip-flop, respectively. The processor further provides means for observing the first set of test signals at an output terminal of the first scan flip-flop based on the test control and scan enable signals.

In yet another embodiment of the present invention, a testable integrated circuit is provided. The testable integrated circuit includes a plurality of observation test points, at least one XOR gate, an AND gate, an OR gate, a multiplexer, and a first scan flip-flop of a scan path of the testable integrated circuit design. An EDA tool is used to insert the at least one XOR gate, an AND gate, and an OR gate between the plurality of observation test points and the first scan flip-flop. The plurality of observation test points corresponds to outputs of a plurality of logic elements of the testable integrated circuit. The at least one XOR gate has a plurality of input terminals connected to the plurality of observation test points for receiving a plurality of test signals and an output terminal for outputting an observation test signal. The AND gate has a first input terminal connected to the output terminal of the at least one XOR gate for receiving the observation test signal, a second input terminal for receiving an external observation point enable signal, and an output terminal for outputting the observation test signal. The OR gate has a first input terminal connected to the output terminal of the AND gate for receiving the observation test signal, a second input terminal for receiving an external scan enable signal, and an output terminal for outputting the observation test signal. The multiplexer has a first input terminal connected to the output terminal of the at least one XOR gate for receiving the observation test signal, a second input terminal for receiving a set of test patterns, a select input terminal for receiving an external test control signal, and an output terminal for outputting at least one of the observation test signal and the set of test patterns. The first scan flip-flop has a data input terminal for receiving a data input signal, a scan input terminal connected to the output terminal of the multiplexer, for receiving at least one of the observation test signal and the set of test patterns, a scan enable input terminal connected to the output terminal of the OR gate for receiving the observation test signal, and an output terminal for outputting at least one of the data input signal, the observation test signal, and the set of test patterns.

Various embodiments of the present invention provide an electronic design automation (EDA) tool for increasing the fault coverage of an integrated circuit design. The integrated circuit design includes a plurality of observation test points corresponding to outputs of a plurality of logic elements of the integrated circuit design. The EDA tool includes a memory that stores the integrated circuit design and a processor that is in communication with the memory. The processor includes means for identifying a first scan flip-flop of the integrated circuit design corresponding to a first set of observation test points of the plurality of observation test points. The first set of observation test points generates a first set of test signals.

The processor includes means for inserting the at least one XOR gate for receiving corresponding first set of test signals from the first set of observation test points. The processor inserts the AND gate for receiving an observation test signal from the at least one XOR gate. The processor inserts the OR gate between the AND gate and the first scan flip-flop. The processor inserts the multiplexer between the at least one XOR gate and the first scan flip-flop for receiving the observation test signal. The processor further includes means for providing an observation test point enable signal, a scan enable signal, a data input signal, and a set of test patterns and a test control signal.

During structural testing of an integrated circuit fabricated from the integrated circuit design, the AND gate provides the observation test signal to the OR gate based on the observation test point enable signal and the OR gate provides the observation test signal to the scan enable input terminal of the first scan flip-flop based on the scan enable signal.

The first scan flip-flop outputs at least one of the set of test patterns and the observation test signal based on the test control signal when the scan enable signal is at logic high state. The multiplexer outputs the set of test patterns and the observation test signal to the scan input terminal of the first scan flip-flop when the test control signal is at logic high and logic low states, respectively. The first scan flip-flop outputs at least one of the set of test patterns, the observation test signal, and the data input signal based on the test control signal and the observation test signal when the scan enable signal is at logic low state. When the observation test signal is at logic low state, the data input signal is outputted at the output terminal of the first scan flip-flop. When the observation test signal is at logic high state, at least one of the set of test patterns and the observation test signal is outputted at the output terminal of the first scan flip-flop based on the test control signal.

Hence, as compared to conventional EDA tools that insert additional scan flip-flops for increasing the fault coverage of the structural testing, the EDA tool of the present invention utilizes the existing first scan flip-flop and the observation test points of the integrated circuit design and inserts at least one XOR gate, the AND gate, the OR gate, and the multiplexer, thereby reducing area overheads of the integrated circuit design. Further, the EDA tool of the present invention does not insert any logic element in a functional path of the integrated circuit design. Hence, functional timing of the integrated circuit design remains unaffected. Further, a testable IC is fabricated using the integrated circuit design.

Figure 2:
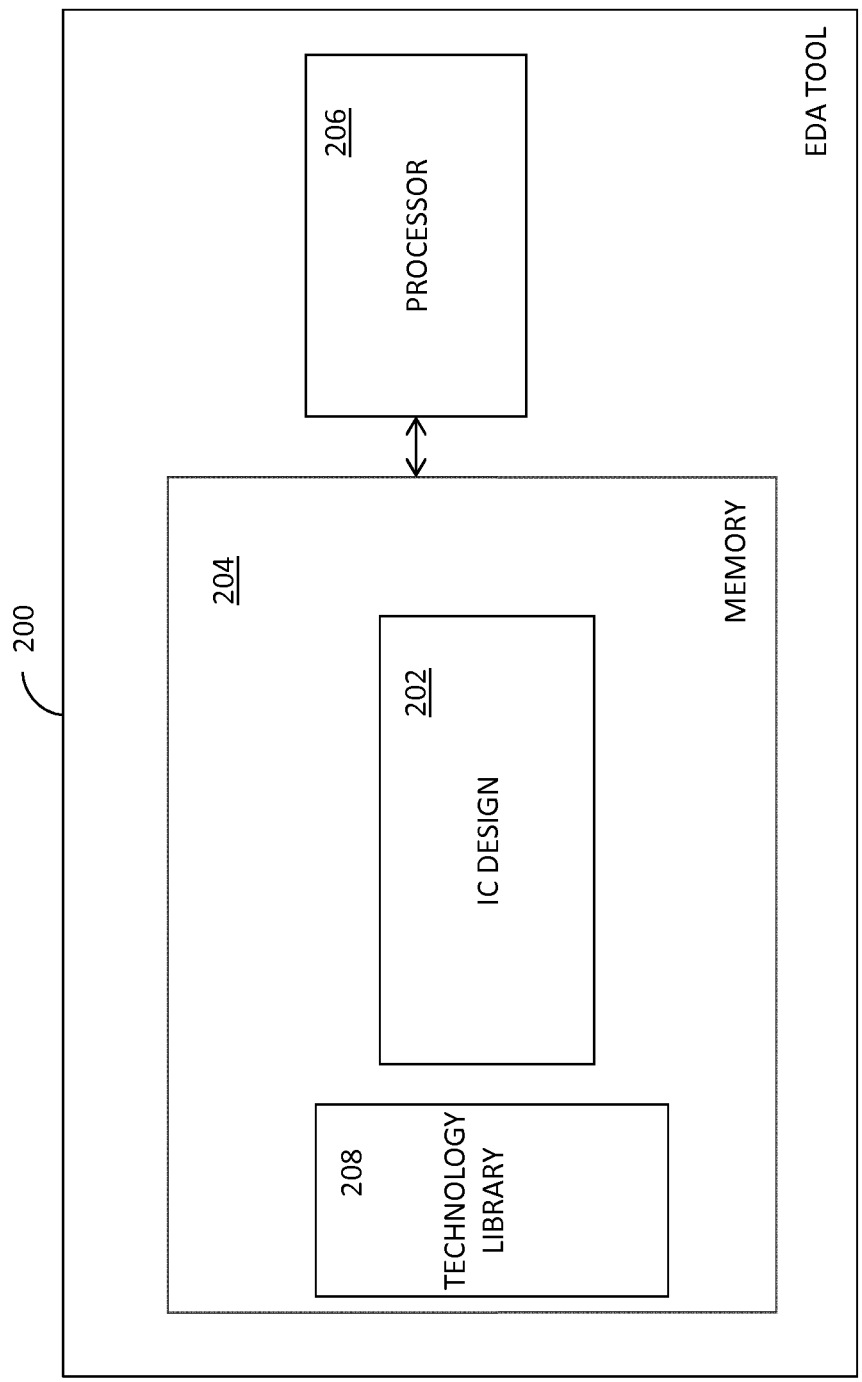
FIG. 2 is a schematic block diagram of an electronic design automation (EDA) tool for increasing the fault coverage of an integrated circuit design in accordance with an embodiment of the present invention.

Referring now to FIG. 2, a schematic block diagram of an EDA tool 200 for increasing the fault coverage of an integrated circuit (IC) design 202 in accordance with an embodiment of the present invention is shown. The EDA tool 200 includes a memory 204 and a processor 206 in communication with the memory 204. The memory 204 includes a technology library 208. The memory 204 receives and stores the IC design 202. The IC design 202 may include any circuit design that includes digital logic elements, digital memory elements, or a combination thereof. Examples of digital logic elements include an AND gate, an OR gate, a NOT gate, a NOR gate, a NAND gate, an XOR gate, an XNOR gate, and/or a combinational logic circuit that includes a combination of the above-mentioned gates. Examples of digital memory elements include a flip-flop, a latch, a shift-register, a mux and a demux. The technology library 208 stores instances of the digital memory elements and digital logic elements.

The processor 206 and the memory 204 comprise a computer system that can range from a stand-alone personal computer to a network of processors and memories, to a mainframe system. The computer system must be able to run verification tools that can simulate digital and analog circuits, such as Incisive™ Unified Simulator (IUS) by Cadence Design Systems, Inc. Such tools and computer systems are known to those of skill in the art. Examples of the IC design 202 include microprocessor, microcontroller unit (MCU), system-on-chip (SOC), and application specific IC (ASIC) designs.

Figure 3:
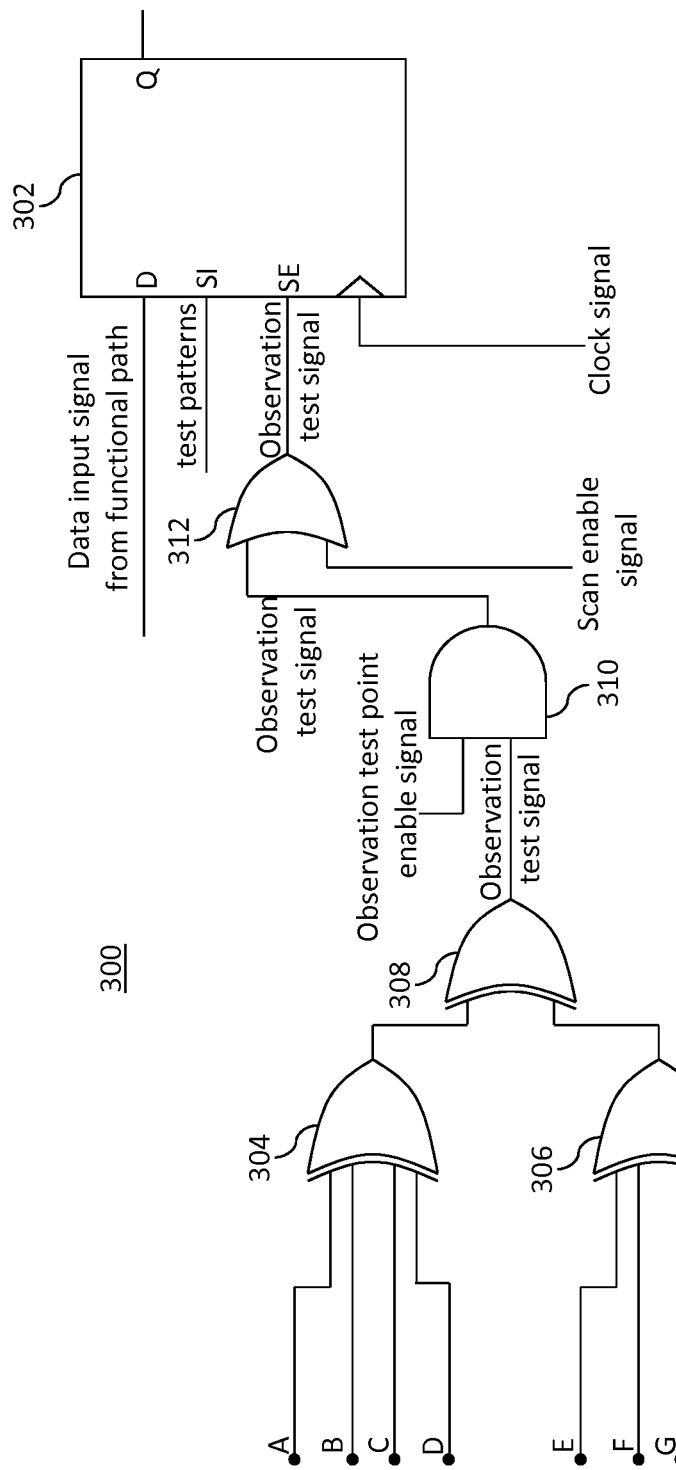
FIG. 3 is a schematic block diagram of an exemplary integrated circuit design in accordance with an embodiment of the present invention.

FIG. 3 shows a schematic block diagram of an exemplary IC design 300, in accordance with an embodiment of the present invention. The EDA tool 200 is used to modify the IC design 300 for increasing the fault coverage of the IC design 300. The IC design 300 includes a first set of observation test points corresponding to outputs of a first set of logic elements (not shown) of the IC design 300, and a first scan flip-flop 302 of a scan path (not shown) of the IC design 300. In an embodiment of the present invention, the first set of observation test point includes first through eighth observation test points (A-H).

In operation, the processor 206 identifies the first scan flip-flop 302 that corresponds to the first set of observation test points and inserts first through third XOR gates (304-308), an AND gate 310, and an OR gate 312 between the first set of observation test points and the first scan flip-flop 302. The processor 206 connects first through fourth input terminals of the first XOR gate 304 to the first through fourth observation test points (A-D), respectively. An output terminal of the first XOR gate 304 outputs a first test signal. The processor 206 connects first through fourth input terminals of a second XOR gate 306 to the fifth through eighth observation test points (E-H), respectively. An output terminal of the second XOR gate 306 outputs a second test signal. The processor 206 connects the output terminal of the first XOR gate 302 to a first input terminal of the third XOR gate 306 for providing the first test signal. The processor connects the output terminal of the second XOR gate 304 to a second input terminal of the third XOR gate 306 for providing the second test signal. An output terminal of the third XOR gate 306 outputs an observation test signal.

The processor 206 connects the output terminal of the third XOR gate 306 to a first input terminal of the AND gate 310 for providing the observation test signal. The processor 206 provides an observation test point enable signal to a second input terminal of the AND gate 310. An output terminal of the AND gate 310 outputs the observation test signal. The processor 206 connects the output terminal of the AND gate 310 to a first input terminal of the OR gate 312 for providing the observation test signal. The processor 206 provides a scan enable signal to a second input terminal of the OR gate 312. An output terminal of the OR gate 312 outputs the observation test signal. The processor 206 provides a data input signal to a data input terminal of the first scan flip-flop 302. The processor 206 receives a set of test patterns from at least one of an automatic test pattern generator (ATPG) and a pseudo random pattern generator (PRPG) and provides the set of test patterns to a scan input terminal of the first scan flip-flop 302. A clock input terminal of the first scan flip-flop 302 receives a clock signal. The processor 206 connects the output terminal of the OR gate 312 to a scan enable input terminal of the first scan flip-flop 302 for providing the observation test signal. An output terminal of the first scan flip-flop 302 outputs at least one of the data input signal and the set of test patterns based on the observation test signal.

The observation test point enable signal is at logic high state during structural testing of the IC design 300. When the scan enable signal is at logic high state during a shift operation of the IC design 300, the set of test patterns are outputted at the output terminal of the first scan flip-flop 302. When the scan enable signal is at logic low state during a capture operation of the IC 300, at least one of the data input signal and the set of test patterns are outputted at the output terminal of the first scan flip-flop 302 based on a logic state of the observation test signal.

In an embodiment of the present invention, the observation test signal is at logic high state when the IC design 300 is not faulty (i.e. the IC design 300 is a good circuit design) and at logic low state when the IC design 300 is faulty (i.e. the IC design 300 is a bad circuit design). The first scan flip-flop 302 outputs the data input signal when the observation test signal is at logic low state, representing the faulty IC design 300. The first scan flip-flop 302 outputs the set of test patterns when the observation test signal is at logic high state, representing the non-faulty IC design 300. In another embodiment of the present invention, the observation test signal is at logic low state when the IC design 300 is not faulty and at logic high state when the IC design 300 is faulty. The first scan flip-flop 302 outputs the set of test patterns when the observation test signal is at logic high state, representing the faulty IC design 300. The first scan flip-flop 302 outputs the data input signal when the observation test signal is at logic low state, representing the non-faulty IC design 300. Thus, the faulty IC design 300 can be detected if the data input signal and the set of test patterns are at different logic states. Since the observation test signal covers all the observation test points, the required fault coverage of the IC design 300 is met by using the existing first scan flip-flop 302 of the scan path, thereby reducing the cost of production, area overheads and functional timing impact of the IC design 300. In another embodiment of the present invention, a testable IC (not shown) fabricated using the IC design 300 can be successfully tested using at least one of scan testing and built-in-self-test (BIST) mechanisms.

Figure 4:
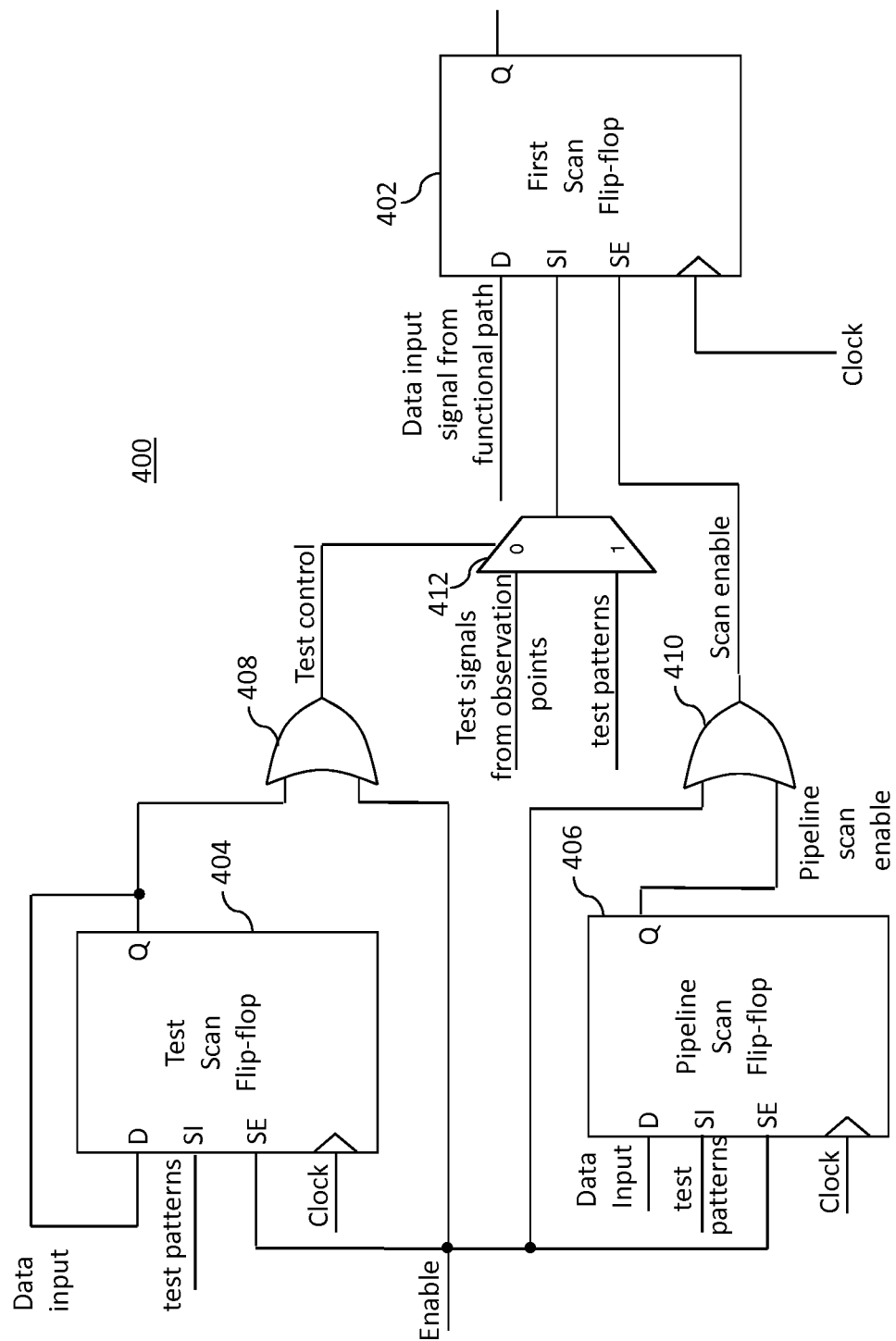
FIG. 4 is a schematic block diagram of another exemplary integrated circuit design in accordance with an embodiment of the present invention.

FIG. 4 shows a schematic block diagram of another exemplary IC design 400, in accordance with an embodiment of the present invention. The EDA tool 200 is used to modify the IC design 400 for increasing the fault coverage of the IC design 400. The IC design 400 includes a first set of observation test points (not shown) corresponding to outputs of a first set of logic elements (not shown) of the IC design 400, a first scan flip-flop 402 of a scan path of the IC design 400, a test scan flip-flop 404, a pipeline scan flip-flop 406, first and second OR gates 408 and 410. In an embodiment of the present invention, the test and pipeline scan flip-flops 404 and 406 are a part of the scan path. The test scan flip-flop 404 has a scan input terminal for receiving a set of test patterns, a scan enable input terminal for receiving an externally generated enable signal, a data input terminal connected to an output terminal thereof for receiving a data input signal, and a clock terminal for receiving a clock signal. The pipeline scan flip-flop 406 has a data input terminal for receiving the data input signal, a scan input terminal for receiving the set of test patterns, a scan enable input terminal for receiving the enable signal, and a clock terminal for receiving the clock signal. An output terminal of the pipeline scan flip-flop 406 outputs a pipeline scan enable signal. The first OR gate 408 has a first input terminal connected to the output terminal of the test scan flip-flop 404 for receiving the data input signal, a second input terminal for receiving the enable signal, and an output terminal for outputting a test control signal. The second OR gate 410 has a first input terminal for receiving the enable signal, a second input terminal connected to the output terminal of the pipeline scan flip-flop 406 for receiving the pipeline scan enable signal, and an output terminal for outputting a scan enable signal.

In operation, the processor 206 identifies the first scan flip-flop 402 that corresponds to the first set of observation test points and inserts a mux 412 between the first set of observation test points and the first scan flip-flop 402. The first set of observation test points generates a first set of test signals. The processor 206 connects the output terminal of the OR gate 408 to a select input terminal of the mux 412 for providing the test control signal. The processor 206 connects the first set of observation test points to a first input terminal of the mux 412 for providing the observation test signal. The processor 206 receives the set of test patterns from at least one of the ATPG and the PRPG and provides the set of test patterns to a second input terminal of the mux 412. An output terminal of the mux 412 outputs at least one of the first set of test signals and the set of test patterns based on a logic state of the test control signal. The processor 206 connects the output terminal of the mux 412 to a scan input terminal of the first scan flip-flop 402 for providing at least one of the first set of test signals and the set of test patterns thereto. The processor 206 provides the data input signal to a data input terminal of the first scan flip-flop 402. The processor 206 connects the output terminal of the second OR gate 410 to a scan enable input terminal of the first scan flip-flop 402 for providing the scan enable signal. A clock input terminal of the first scan flip-flop 402 receives the clock signal. An output terminal of the first scan flip-flop 402 outputs at least one of the first set of test signals and the set of test patterns based on a logic state of the test control signal.

When the enable signal is at logic high state during a shift operation of the IC design 400, the output terminals of the first OR gate 408 and the second OR gate 410 generate logic high test control and scan enable signals, respectively. The mux 412 receives the logic high test control signal at the select input terminal thereof and outputs the set of test patterns to the scan input terminal of the first scan flip-flop 402. Hence, the first scan flip-flop 402 outputs the set of test patterns at the output terminal thereof when the test control and the scan enable signals are at logic high states.

During a functional mode of operation of the IC 400, the enable signal is at logic low state. The pipeline scan enable signal is at least at a logic high or logic low state during the capture operation. In an embodiment of the present invention, when the pipeline scan enable signal is at logic high state during the capture operation, the scan enable signal is generated at logic high state at the output terminal of the second OR gate 410. Hence, at least one of the first set of test signals and the set of test patterns are outputted at the output terminal of the first scan flip-flop 402 based on the logic state of the test control signal. If the test control signal is generated at logic low state, the mux 412 outputs the first set of test signals to the scan input terminal of the first scan flip-flop 402. If the test control signal is generated at logic high state, the mux 412 outputs the set of test patterns to the scan input terminal of the first scan flip-flop 402. In another embodiment of the present invention, when the pipeline scan enable signal is at logic low state during the capture operation, the scan enable signal is generated at logic low state at the output terminal of the second OR gate 410. Hence, the first scan flip-flop 402 outputs the data input signal at the output terminal thereof. Further, the first scan flip-flop 404, the test scan flip-flop 404, and the pipeline scan flip-flop 406 are a part of the scan path of the IC design 400. Thus, no additional flip-flops are added to the IC design 400 and hence, the structural testing of the IC design 400 does not incur additional costs of production and area overheads. In another embodiment of the present invention, a testable IC (not shown) fabricated using the IC design 400 can be successfully tested using at least one of scan testing and built-in-self-test (BIST) mechanisms.

Figure 5:
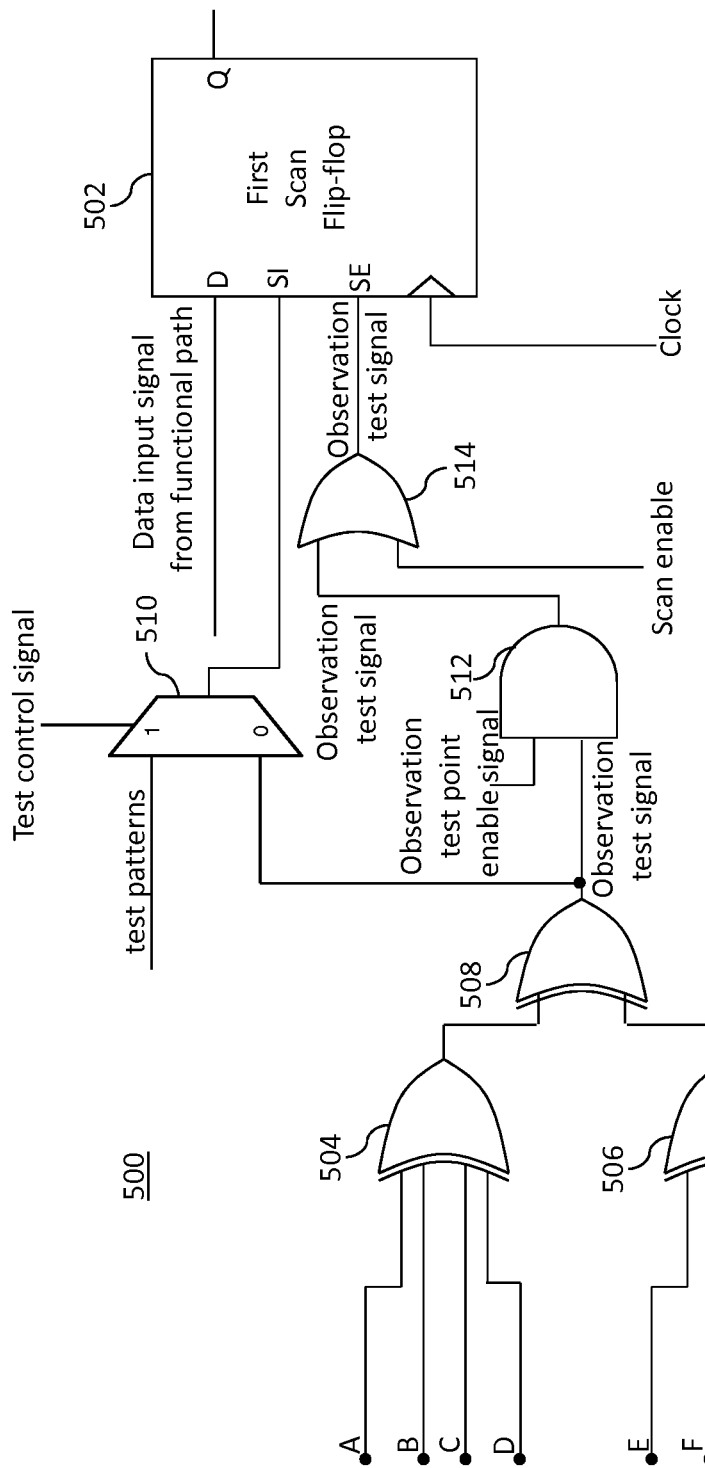
FIG. 5 is a schematic block diagram of a testable integrated circuit in accordance with an embodiment of the present invention.

FIG. 5 shows a schematic block diagram of a testable IC 500, in accordance with an embodiment of the present invention. The testable IC 500 includes a first set of observation test points (A-H) corresponding to outputs of a first set of logic elements (not shown) of the testable IC 500, a first scan flip-flop 502 of a scan path (not shown) of the testable IC 500, first through third XOR gates (504-508), mux 510, an AND gate 512, and an OR gate 514. The EDA tool 200 is used to modify the IC 500 for increasing the fault coverage thereof during the design stage of the testable IC 500. The EDA tool 200 inserts first through third XOR gates (504-508), a mux 510, an AND gate 512, and an OR gate 514 between the first set of observation test points and the first scan flip-flop 502. The testable IC 500 is fabricated based on the modified IC design 500. First through fourth input terminals of the first XOR gate 504 are connected to the observation test points A, B, C, and D, respectively. An output terminal of the first XOR gate 504 outputs a first test signal. First through fourth input terminals of the second XOR gate 506 are connected to the observation test points E, F, G, and H, respectively. An output terminal of the second XOR gate 506 outputs a second test signal. The third XOR gate 508 has a first input terminal connected to the output terminal of the first XOR gate 504 for receiving the first test signal, a second input terminal connected to the output terminal of the second XOR gate 506 for receiving the second test signal, and an output terminal for outputting an observation test signal. The mux 510 has a select input terminal for receiving an external test control signal, a first input terminal connected to the output terminal of the third XOR gate 508 for receiving the observation test signal, and a second input terminal for receiving a set of test patterns. In an example, the set of test patterns are generated by an ATPG or PRPG (not shown) when the testable IC 500 is structurally tested by an ATE (not shown). In another example, the set of test patterns are generated internally by the testable IC 500 when BIST is invoked. An output terminal of the mux 510 outputs at least one of the set of test patterns and the observation test signal based on a logic state of the test control signal.

The AND gate 512 has a first input terminal connected to the output terminal of the third XOR gate 508 for receiving the observation test signal, a second input terminal for receiving an external observation test point enable signal, and an output terminal for outputting the observation test signal. The OR gate 514 has a first input terminal connected to the output terminal of the AND gate 512 for receiving the observation test signal, a second input terminal for receiving an external scan enable signal, and an output terminal for outputting the observation test signal. A data input terminal of the first scan flip-flop 502 receives a data input signal. A scan input terminal of the first scan flip-flop 502 is connected to the output terminal of the mux 510 for receiving at least one of the set of test patterns and the observation test signal. A scan enable input terminal of the first scan flip-flop 502 is connected to the output terminal of the OR gate 514 for receiving the observation test signal. An output terminal of the first scan flip-flop 502 outputs at least one of the data input signal, the set of test, and the observation test signal.

In operation, the observation test point enable signal is at logic high state during structural testing of the testable IC 500. When the scan enable signal is at logic high state during a shift operation of the testable IC 500, at least one of the set of test patterns and the observation test signal are outputted at the output terminal of the first scan flip-flop 502 based on a logic state of the test control signal. When the scan enable signal is at logic low state during a capture operation of the testable IC 500, at least one of the data input signal and the set of test patterns are outputted at the output terminal of the first scan flip-flop 502 based on a logic state of the observation test signal. If the test control signal is at logic low state, the mux 510 outputs the observation test signal to the scan input terminal of the first scan flip-flop 502. If the test control signal is at logic high state, the mux 510 outputs the set of test patterns to the scan input terminal of the first scan flip-flop 502.

When the scan enable signal is at logic low state during a capture operation of the testable IC 500, at least one of the data input signal, the set of test patterns, and the observation test signal are outputted at the output terminal of the first scan flip-flop 502. In an embodiment of the present invention, the observation test signal is at logic high state when the testable IC 500 is not faulty (i.e. the modified IC design 500 corresponding to the testable IC 500 is a good circuit design) and at logic low state when the testable IC design 500 is faulty (i.e. the modified IC design 500 corresponding to the testable IC 500 is a bad circuit design). The first scan flip-flop 502 outputs the data input signal when the observation test signal is at logic low state, representing the faulty testable IC 500. The first scan flip-flop 502 outputs at least one of the observation test signal and the set of test patterns when the observation test signal is at logic high state, representing the non-faulty testable IC 500. In another embodiment of the present invention, the observation test signal is at logic low state when the testable IC 500 is not faulty and at logic high state when the testable IC 500 is faulty. The first scan flip-flop 502 outputs at least one of the observation test signal and the set of test patterns when the observation test signal is at logic high state, representing the faulty testable IC 500. The first scan flip-flop 502 outputs the data input signal when the observation test signal is at logic low state, representing the non-faulty testable IC 500. Hence, required fault coverage of the testable IC 500 is met by using the existing first scan flip-flop 502 of the scan path, thereby reducing the cost of production and area over heads of the testable IC 500.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An electronic design automation (EDA) tool for increasing the fault coverage of an integrated circuit (IC) design, wherein the IC design includes a plurality of observation test points corresponding to outputs of a plurality of logic elements of the IC design, the EDA tool comprising:
a memory that stores the IC design; and
a processor in communication with the memory, wherein the processor includes:
means for identifying a first scan flip-flop of the IC design corresponding to a first set of observation test points of the plurality of observation test points, wherein the first set of observation test points generate a first set of test signals;
means for inserting at least one XOR gate, an AND gate, and an OR gate between the first set of observation test points and the first scan flip-flop, by connecting a first set of input terminals of the XOR gate to the first set of observation test points for receiving the first set of test signals, an output terminal of the XOR gate to a first input terminal of the AND gate for providing an observation test signal thereto, an output terminal of the AND gate to a first input terminal of the OR gate, and an output terminal of the OR gate to a scan enable input terminal of the first scan flip-flop;
means for providing an observation test point enable signal to a second input terminal of the AND gate, a scan enable signal to a second input terminal of the OR gate, and a data input signal and a set of test patterns to data and scan input terminals of the first scan flip-flop, respectively, wherein the AND gate provides a first intermediate observation test signal to the OR gate based on the observation test point enable signal and the OR gate provides a second intermediate observation test signal to the scan enable input terminal of the first scan flip-flop based on the scan enable signal; and
means for observing at least one of the data input signal and the set of test patterns at an output terminal of the first scan flip-flop.

2. The EDA tool of claim 1, wherein the data input signal is one of an internally and an externally generated data input signal.

3. The EDA tool of claim 1, wherein the set of test patterns are generated by at least one of a linear feedback shift register (LFSR) of the IC design and an external automatic test pattern generator (ATPG) tool.

4. The EDA tool of claim 1, wherein the scan enable signal is at a logic high state during a shift operation and a logic low state during a capture operation of the IC design.

5. The EDA tool of claim 4, wherein the first scan flip-flop outputs the set of test patterns at the output terminal thereof during the shift operation.

6. The EDA tool of claim 4, wherein the first scan flip-flop outputs the set of test patterns when the second intermediate observation test signal is at a logic high state, during the capture operation.

7. The EDA tool of claim 6, wherein the first scan flip-flop outputs the data input signal when the second intermediate observation test signal is at a logic low state, during the capture operation.

8. An electronic design automation (EDA) tool for increasing the fault coverage of an integrated circuit design, wherein the integrated circuit design includes a plurality of observation test points corresponding to outputs of a plurality of logic elements of the integrated circuit design, the EDA tool comprising:
a memory that stores the integrated circuit design; and
a processor in communication with the memory, wherein the processor includes:
means for identifying a first scan flip-flop of the integrated circuit design corresponding to a first set of observation test points of the plurality of observation test points, wherein the first set of observation test points generate a first set of test signals;
means for inserting a multiplexer between the first set of observation test points and the first scan flip-flop by connecting a first input terminal of the multiplexer to the first set of observation test points for receiving the first set of test signals and an output terminal of the multiplexer to a scan input terminal of the first scan flip-flop;
means for providing a set of test patterns to a second input terminal of the multiplexer, a test control signal to a select input terminal of the multiplexer, and a scan enable signal and a data input signal to scan enable and data input terminals of the first scan flip-flop, respectively; and means for observing the first set of test signals at an output terminal of the first scan flip-flop based on the test control and scan enable signals.

9. The EDA tool of claim 8, wherein the multiplexer outputs the first set of test signals when the test control signal is at a logic low state and the set of test patterns when the test control signal is at a logic high state.

10. The EDA tool of claim 9, wherein the first scan flip-flop outputs one of the set of test patterns and the first set of test signals when the scan enable signal is at a logic high state.

11. The EDA tool of claim 10, wherein the first scan flip-flop outputs the data input signal when the scan enable signal is at a logic low state.

12. A testable integrated circuit, comprising:
a plurality of observation test points that correspond to outputs of a plurality of logic elements of the testable integrated circuit;
at least one XOR gate having a plurality of input terminals connected to the plurality of observation test points for receiving a plurality of test signals, and an output terminal for outputting an observation test signal;
an AND gate having a first input terminal connected to the output terminal of the XOR gate for receiving the observation test signal, a second input terminal for receiving an external observation point enable signal, and an output terminal for outputting a first intermediate observation test signal;
an OR gate having a first input terminal connected to the output terminal of the AND gate for receiving the first intermediate observation test signal, a second input terminal for receiving an external scan enable signal, and an output terminal for outputting a second intermediate observation test signal;
a multiplexer having a first input terminal connected to the output terminal of the XOR gate for receiving the observation test signal, a second input terminal for receiving a set of test patterns, a select input terminal for receiving an external test control signal, and an output terminal for outputting one of the observation test signal and the set of test patterns; and
a first scan flip-flop having a data input terminal for receiving a data input signal, a scan input terminal connected to the output terminal of the multiplexer for receiving one of the observation test signal and the set of test patterns, a scan enable input terminal connected to the output terminal of the OR gate for receiving the second intermediate observation test signal, and an output terminal for outputting one of the data input signal, the observation test signal, and the set of test patterns.

13. The testable integrated circuit of claim 12, wherein the testable integrated circuit undergoes structural testing, and wherein the structural testing includes at least one of a built-in-self-testing (BIST) and scan testing.

14. The testable integrated circuit of claim 13, wherein the multiplexer outputs the observation test signal when the external test control signal is at a logic low state and the set of test patterns when the external test control signal is at a logic high state.

15. The testable integrated circuit of claim 14, wherein the observation test point enable signal is at logic high state during the structural testing of the testable integrated circuit.

16. The testable integrated circuit of claim 15, wherein the scan enable signal is at a logic high state during a shift operation and a logic low state during a capture operation of the testable integrated circuit.

17. The testable integrated circuit of claim 16, wherein the first scan flip-flop outputs one of the observation test signal and the set of test patterns during the shift operation.

18. The testable integrated circuit of claim 16, wherein the first scan flip-flop outputs one of the observation test signal and the set of test patterns when the second intermediate observation test signal is at a logic high state, during the capture operation.

19. The testable integrated circuit of claim 12, wherein the set of test patterns are generated internally by the testable integrated circuit during built-in self-test (BIST) testing.

* * * * *